(12) United States Patent
Sun et al.

(10) Patent No.: US 7,888,271 B2
(45) Date of Patent: Feb. 15, 2011

(54) METHOD OF MANUFACTURING SILICON NANO-STRUCTURE

(75) Inventors: Hai-Lin Sun, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/291,301

(22) Filed: Nov. 6, 2008

(65) Prior Publication Data

US 2009/0253248 A1  Oct. 8, 2009

(30) Foreign Application Priority Data

Apr. 3, 2008  (CN) .................. 2008 1 0066397

(51) Int. Cl.
*H01L 21/31* (2006.01)

(52) U.S. Cl. .................. 438/758; 438/478; 438/795; 438/903; 257/E21.476; 257/E21.478; 977/855; 977/857

(58) Field of Classification Search ................. 438/503, 438/903; 257/E21.478, E21.497; 977/840, 977/855, 857, 859
See application file for complete search history.

(56) References Cited

U.S. PATENT DOCUMENTS

| 3,768,972 | A | * | 10/1973 | Taylor et al. ................. 23/300 |
| 6,323,142 | B1 | | 11/2001 | Yamazaki et al. |
| 6,399,429 | B1 | * | 6/2002 | Yamoto et al. ............... 438/166 |
| 6,797,323 | B1 | * | 9/2004 | Kashiwagi et al. ...... 427/255.29 |
| 2002/0016258 | A1 | * | 2/2002 | Wu et al. ..................... 502/158 |
| 2002/0111040 | A1 | * | 8/2002 | Yamazaki et al. ............ 438/783 |
| 2003/0013280 | A1 | * | 1/2003 | Yamanaka .................... 438/487 |
| 2008/0044336 | A1 | * | 2/2008 | Kamisako et al. ............ 423/349 |

FOREIGN PATENT DOCUMENTS

CN    1156897    8/1997

* cited by examiner

*Primary Examiner*—Charles D Garber
*Assistant Examiner*—Cheung Lee
(74) *Attorney, Agent, or Firm*—D. Austin Bonderer

(57) ABSTRACT

A method for making silicon nano-structure, the method includes the following steps. Firstly, providing a growing substrate and a growing device, the growing device comprising a heating apparatus and a reacting room. Secondly, placing the growing substrate and a quantity of catalyst separately into the reacting room. Thirdly, introducing a silicon-containing gas and hydrogen gas into the reacting room. Lastly, heating the reacting room to a temperature of 500~1100° C.

20 Claims, 6 Drawing Sheets

METHOD OF MANUFACTURING SILICON NANO-STRUCTURE

BACKGROUND

1. Field of the Invention

The present invention relates to methods for making nano materials and, particularly, to a method for making a silicon nano-structure.

2. Discussion of Related Art

Silicon is one of the most favored materials in the semiconductor industry, and it has been used in the IC industry for many years. Silicon nano materials have been applied in such things as field emission electronic devices, solar batteries and diluted magnetic semiconductor devices, due to their outstanding mechanical and electrical properties. Therefore, achieving various silicon nano materials is desirable.

A conventional method for making a silicon nano material includes the following steps: providing a silicon wafer; forming a metal catalyst layer on a surface of the wafer; putting the wafer with catalyst layer into a quartz tube; introducing a silicon-containing gas and hydrogen gas into the quartz tube; and heating the quartz tube to a temperature of 500~1000° C. to grow a silicon nano material.

However, there are some drawbacks to using this method. Firstly, the step of forming a metal catalyst layer on the wafer is usually preformed in vacuum and requires a depositing device, thus increasing costs. Secondly, the metal catalyst is gold, copper or iron, which have high melting points and low growing efficiency.

What is needed, therefore, is a method of making silicon nano-structure that will reduce the cost.

BRIEF DESCRIPTION OF THE DRAWINGS

Many aspects of the present method for making the silicon nano-structure can be better understood with references to the following drawings. The components in the drawings are not necessarily drawn to scale, the emphasis instead being placed upon clearly illustrating the principles of the present method for making the silicon nano-structure.

Figure 1:
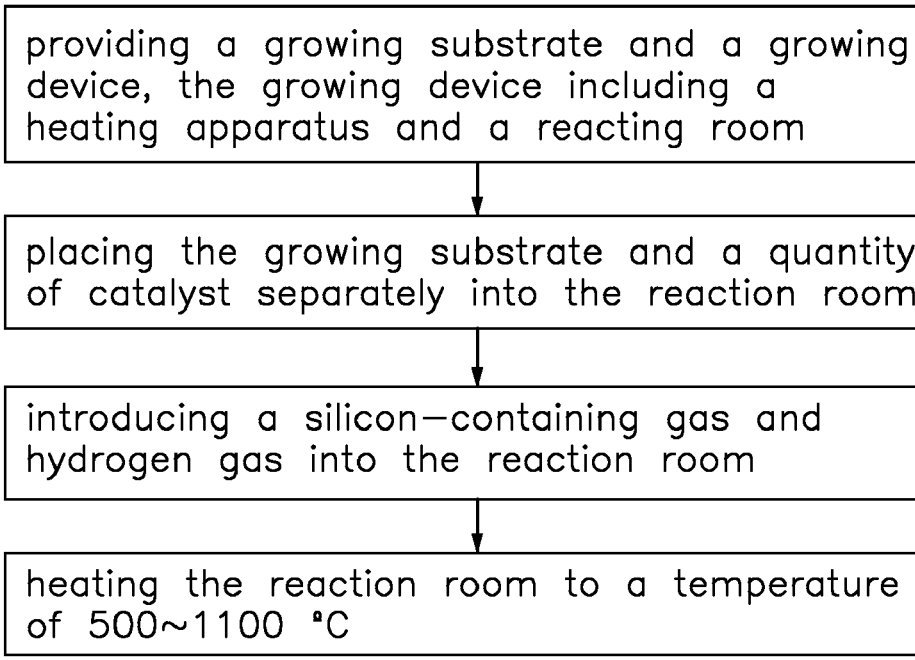
FIG. 1 is a flow chart of a method for making a silicon nano-structure, in accordance with a present embodiment.

Corresponding reference characters indicate corresponding parts throughout the several views. The exemplifications set out herein illustrate at least one embodiment of the present method for making the silicon nano-structure, in at least one form, and such exemplifications are not to be construed as limiting the scope of the invention in any manner.

DETAILED DESCRIPTION

References will now be made to the drawings to describe, in detail, various embodiments of the present method for making a silicon nano-structure.

Figure 2:
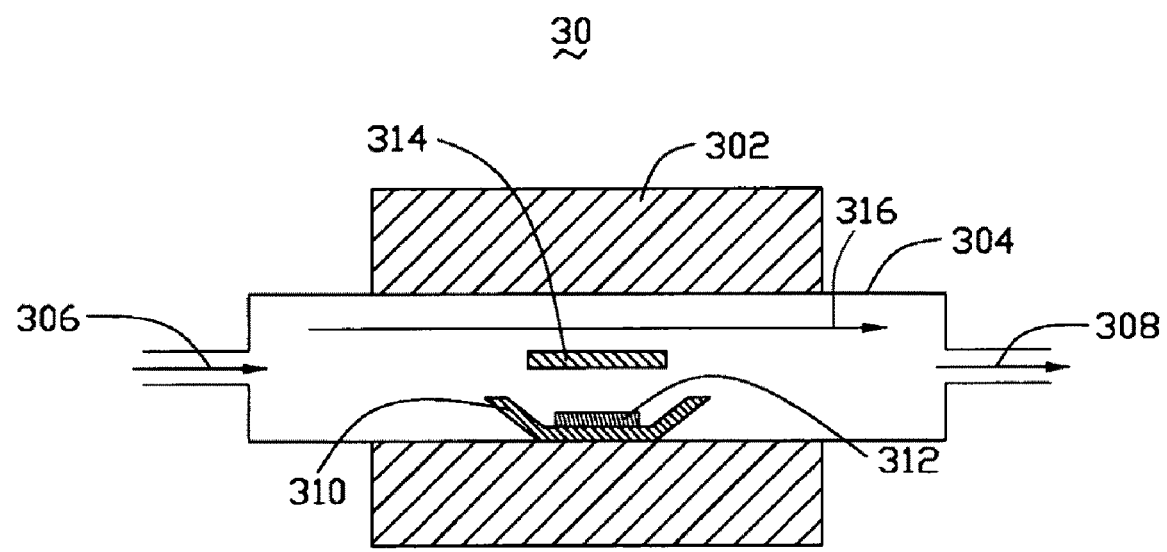
FIG. 2 is a schematic view of a growing device used for making the silicon nano-structure of FIG. 1.

Referring to FIGS. 1 and 2, a method for making a silicon nano-structure includes the following steps: (a) providing a growing substrate 314 and a growing device 30, the growing device 30 including a heating apparatus 302 and a reacting room 304; (b) placing the growing substrate 314 and a quantity of catalyst 312 separately into the reacting room 304; (c) introducing a silicon-containing gas and hydrogen gas into the reacting room 304; and (d) heating the reacting room to a temperature of 500~1100° C.

In step (a), the reacting room 304 can be a quartz tube with a gas inlet 306 at one end and a gas outlet 308 at an opposite end. The quartz tube is movably located in the heating apparatus 302. The length of the quartz tube is more than the length of the heating apparatus 302 so that part of the tube can be used as a handle when moving it while still keeping a substantial part of it heated in the heating apparatus 302.

Moreover, a carrier 310 with a high melting point can be disposed in the reacting room 304. In the present embodiment, the carrier 310 is a ceramic boat. The shape of the ceramic boat 310 is arbitrary and the volume thereof can be selected according to need.

In step (a), the growing substrate 314 used is made from a non-metallic material with a high melting point (e.g. silicon, silicon dioxide, quartz, glass, sapphire, etc). In the present embodiment, the growing substrate 314 is a silicon wafer. The silicon wafer with different surface orientations may be used and herein is one of a (100) silicon wafer, a (110) silicon wafer, and a (111) silicon wafer. The crystal surface planes of the substrate 314 are used as epitaxial growth surfaces. The size of the silicon wafer is arbitrary and can be selected according to need. The growing substrate 314 is cleaned by ultrasonic vibration before being placed into the reacting room 304. The period of time for cleaning the growing substrate 314 ranges from approximately 10 to 30 minutes.

In step (b), the catalyst 312 is a metal material selected from a group comprising gold, copper, iron, nickel and aluminum. The catalyst 312 can be a block or in powder form. In the present embodiment, the catalyst 312 is a quantity of aluminum powder and the purity of the aluminum powder is more than 99.9%. Before placing the catalyst 312 into the reacting room 304, the catalyst 312 is placed into a diluted acid solution for a period of time (e.g. from about 2 to 10 minutes) to remove the oxide layer and other impurities on the surface of the catalyst 312. In the present embodiment, the diluted acid solution is diluted hydrochloric acid solution.

In step (b), the catalyst 312 can be placed in the carrier 310. The growing substrate 314 could be placed anywhere in the reacting room 304 as long as one surface of the growing substrate 314 can be exposed to the silicon-containing gas and hydrogen gas introduced in the following step (c) and the vaporized catalyst 312 can be deposited on the same surface of growing substrate 314. The growing substrate 314 can be placed directly above the carrier 310 or between the carrier 310 and the gas outlet 308. In other embodiments, the growing substrate 314 and the catalyst 312 can both be placed in the carrier 310 but not contacting each other. In the present embodiment, the growing substrate 314 is placed above the carrier 310 and free of any catalyst when the growing substrate 314 is placed into the reacting room 304.

Before step (c), an optional step (e) of introducing a protective gas into the reacting room 304 could be carried out. The protective gas is used to evacuate the air in the reacting room 304. In the step (e), the protective gas form a gas flow direction 316 from the gas inlet 306 to the gas outlet 308. The flow rate of the protective gas ranges approximately from 100 to 2000 milliliter per minute. The protective gas is selected from a group comprising nitrogen (N$_2$) gas and noble gases. In the present embodiment, the protective gas is argon (Ar) gas.

In step (c), the silicon-containing gas and hydrogen gas are introduced into the reacting room 304 after the atmospheric air in the reacting room 304 has been entirely evacuated by the protective gas. The silicon-containing gas is introduced in a manner so that it flows from the catalyst 312 to the growing substrate 314. It is to be understood that one or more guides (not shown) can be used to direct the flow of the silicon-containing gas. The protective gas is still added during the introduction of the silicon-containing gas and hydrogen gas. The air pressure in the reacting room 304 ranges approximately from 1 to 50 torrs. The flow rate ratio of silicon-containing gas and hydrogen gas ranges approximately from 10:1 to 1:10. The silicon-containing gas can be selected from a group comprising silicon halide, silane, silane derivative, halogenated silane, and combinations thereof. The flow rate of the silicon-containing gas ranges approximately from 10 to 1000 milliliters per minute. The purity of the hydrogen gas is more than 99.99%. The flow rate of the hydrogen gas ranges approximately from 10 to 1000 milliliters per minute. In the present embodiment, the silicon-containing gas is silicon tetrachloride (SiCl$_4$) gas and the flow rate of the silicon-containing gas is 150 milliliters per minute. The flow rate of the hydrogen gas is 200 milliliters per minute.

In step (d), the reacting temperature depends on the catalyst 312 and ranges approximately from 500 to 1100° C. The rate the temperature increases in the reacting room 304 is 20° C. per minute. The period of time for growing the silicon nano-structure ranges approximately from 10 to 90 minutes. It is to be understood that the process of introducing the silicon-containing gas and hydrogen gas into the reacting room 304 could be carried out after heating the reacting room 304 to the reacting temperature or at the same time as heating the reacting room 304.

In the present embodiment, the catalyst 312 is aluminum powder and the reacting temperature is 800° C. The melting point of the aluminum powder of the present embodiment is 660° C. While the reacting room 304 is heated to a temperature above 660° C., all of the aluminum powder melts and begins to vaporize. The vaporized aluminum deposits on a surface of the growing substrate 314. The silicon-containing gas reacts with the hydrogen gas under the action of the aluminum catalyst 312 to fabricate silicon nano-structure on the growing substrate 314. The silicon nano-structure includes silicon nano wires and silicon nano pyramids. Both the silicon nano wires and silicon nano pyramids grow along an epitaxial <111> direction of the corresponding crystal planes.

Figure 3:
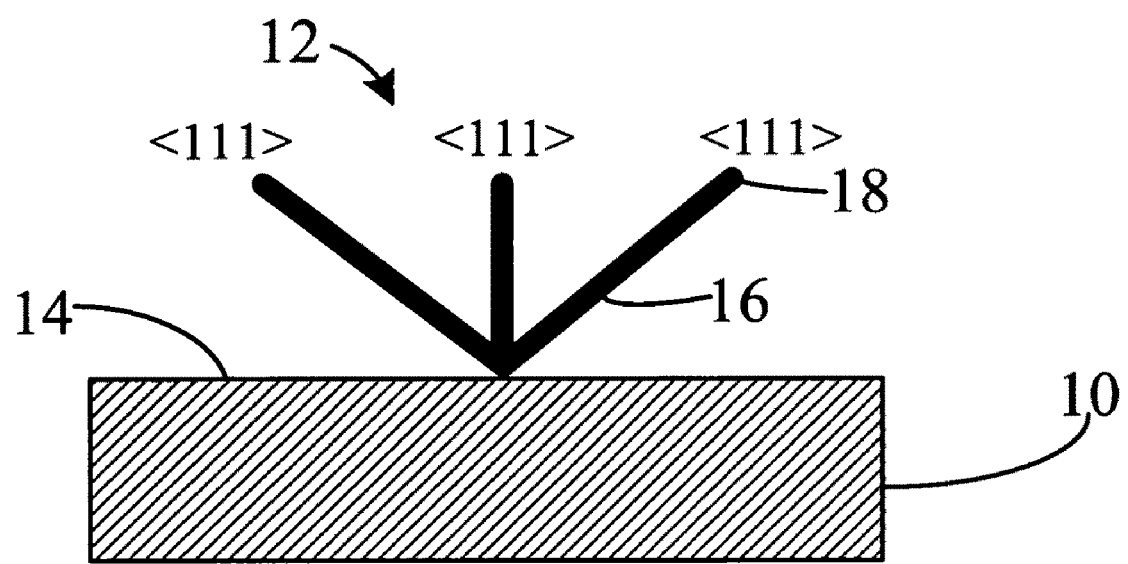
FIG. 3 is a schematic view of a silicon nano-structure formed by the method of FIG. 1.
Figure 4:
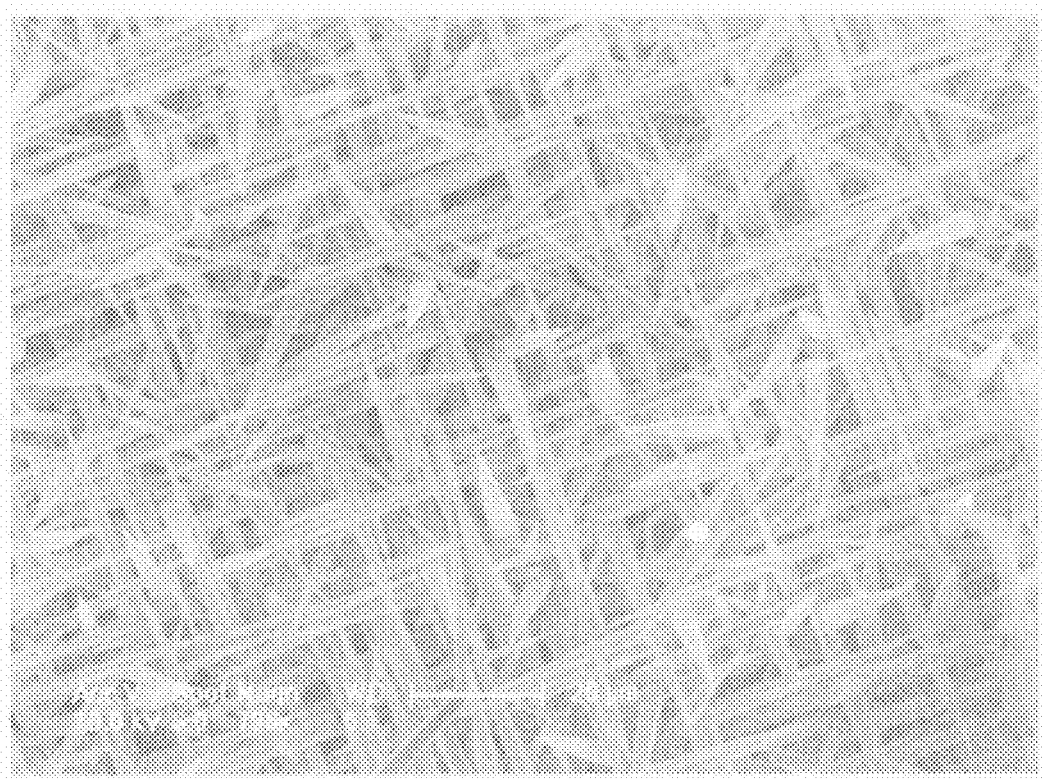
FIG. 4 is a Scanning Electron Microscope (SEM) image of a silicon nano-structure formed by the method of FIG. 1.

Referring to FIGS. 3 and 4, a silicon nano-structure 12 fabricated on a (100) silicon wafer 10 corresponding to the present embodiment is shown. The (100) silicon wafer 10 includes a (100) crystal plane 14. The silicon nano-structure 12 includes a plurality of silicon nano pyramids 16 formed on the (100) crystal plane 14 of the (100) silicon wafer 10. The silicon nano pyramids 16 are of a single crystalline structure, and form and grow along the four epitaxial <111> directions of the (100) crystal plane 14. Each silicon nano pyramid 16 includes a point 18 and the point 18 extends away from the (100) crystal plane 14 along the epitaxial <111> direction. A length of the silicon nano pyramid 16 is arbitrary. In the present embodiment, the lengths of the silicon nano pyramids 16 range approximately from 50 to 100 nanometers and the silicon nano pyramid 16 are hexagonal.

Furthermore, step (d) includes the substeps of: (d1) heating the reacting room to 500~1100° C. to fabricate silicon nano-structure; (d2) suspend heating for a period of time; and (d3) then restart heating the reacting room to 500~1100° C. again to fabricate branched silicon nano-structures.

In step (d2), suspending the heating after growing the silicon nano-structure for a period of time allows the reacting room 304 to cool down. As the reacting room 304 is cooling down, the aluminum catalyst 312 stops vaporizing and the silicon nano-structure stops growing.

In step (d3), restarting heating of the reacting room 304 to the reacting temperature and vaporizing the aluminum catalyst 312 restarts the reaction. The silicon-containing gas reacts with the hydrogen gas again under the action of the aluminum catalyst 312 to fabricate branched silicon nano-structure on the surface of the silicon nano-structure. The branched silicon nano-structure includes the silicon nano wires and silicon nano pyramids too. Both the silicon nano wires and silicon nano pyramids is substantially perpendicular to the crystal plane of the silicon wafer.

Figure 5:
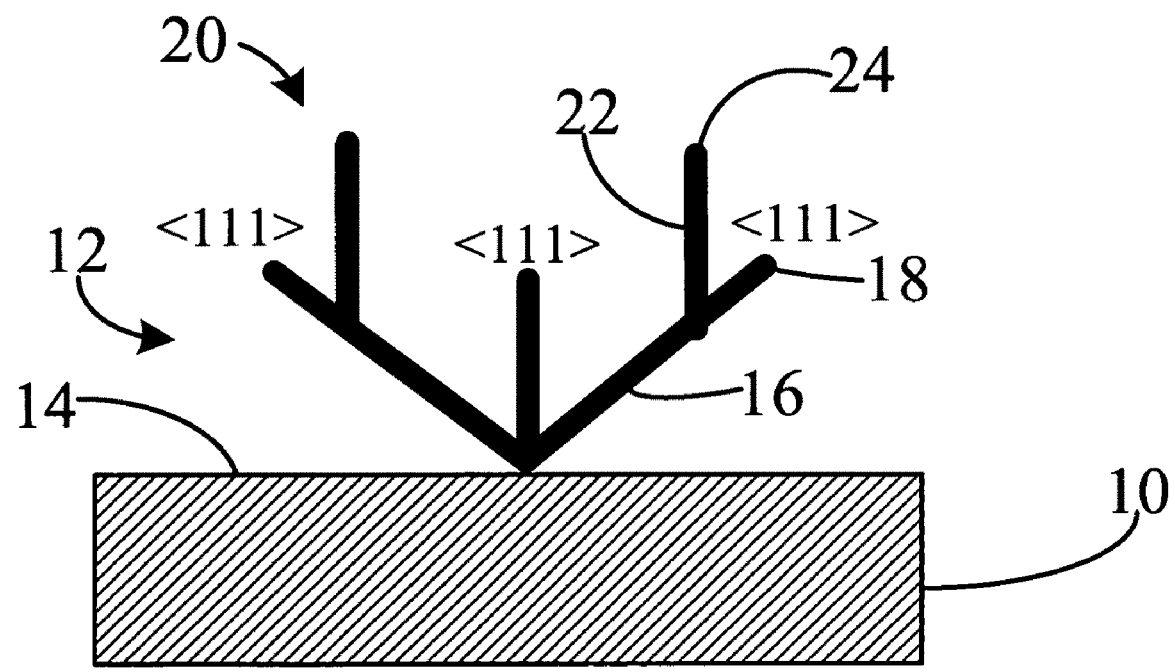
FIG. 5 is a schematic view of a branched silicon nano-structure formed by the method of FIG. 1.
Figure 6:
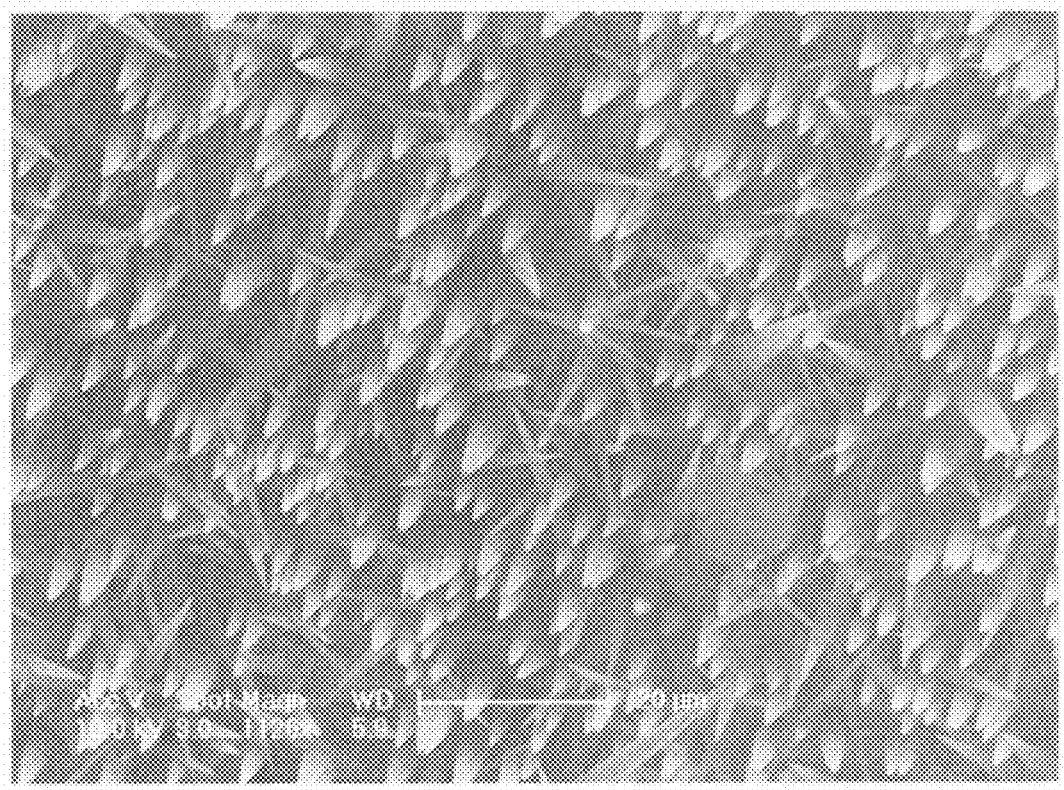
FIG. 6 is a Scanning Electron Microscope (SEM) image of a branched silicon nano-structure formed by the method of FIG. 1.

Referring to FIGS. 5 and 6, a branched silicon nano-structure 20 is fabricated on the surface of the silicon nano-structure 12 in the present embodiment. The branched silicon nano-structure 20 including a plurality of silicon nano pyramids 22. The silicon nano pyramids 22 in the branched silicon nano-structure 20 have the same structure as the silicon nano pyramids 16 in the silicon nano-structure 12. The silicon nano pyramids 22 in the branched silicon nano-structure 20 are substantially perpendicular to the (100) crystal plane 14 of the (100) silicon wafer 10. The point 24 of the silicon nano pyramids 22 in the branched silicon nano-structure 20 extends away from the (100) crystal plane 14.

The present method for making the silicon nano-structure has many advantages including the following. Firstly, the catalyst does not need to be deposited on the growing substrate, thereby simplifying the process and reducing costs. Secondly, when using materials such aluminum powder that have a low melting point and are easy to vaporize, a growing efficiency of silicon nano-structures is achieved.

Finally, it is to be understood that the above-described embodiments are intended to illustrate, rather than limit, the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making silicon nano-structure, the method comprising the following steps of:
   (a) providing a growing substrate and a growing device, the growing device comprising a heating apparatus and a reacting room;
   (b) placing the growing substrate and a quantity of a catalyst, that is separate from the growing substrate, into the reacting room, wherein the catalyst is pure aluminum;
   (c) introducing a silicon-containing gas and a hydrogen gas into the reacting room;
   (d) heating the reacting room to a temperature of about 660° C. to about 1100° C., and the silicon-containing gas reacts with the hydrogen gas under a catalysis of the pure aluminum to fabricate silicon nano-structure on the growing substrate;
   (e) suspending the heating for a period of time to stop fabricating silicon nano-structure; and (f) restarting heating the reacting room to a temperature of about 660° C. to about 1100° C. to fabricate branched silicon nano-structure on a surface of the silicon nano-structure.

2. The method as claimed in claim 1, wherein the growing substrate is free of any catalyst when the growing substrate is placed into the reacting room.

3. The method as claimed in claim 1, wherein the growing substrate is selected from a group comprising silicon, silicon dioxide, quartz, glass, and sapphire.

4. The method as claimed in claim 1, wherein the growing substrate is one of a (100) silicon wafer, a (110) silicon wafer, and a (111) silicon wafer.

5. The method as claimed in claim 4, wherein the growing substrate is a (100) silicon wafer having a (100) crystal plane; the silicon nano-structure comprises a plurality of first silicon nano pyramids formed on the (100) crystal plane, and the plurality of first silicon nano pyramids is a single crystalline and grows along a epitaxial <111>direction of the (100) crystal plane.

6. The method as claimed in claim 5, wherein the branched silicon nano-structure comprises a plurality of second silicon nano pyramids; and the plurality of second silicon nano pyramids is formed on the plurality of first silicon nano pyramids and substantially perpendicular to the (100) crystal plane.

7. The method as claimed in claim 1, wherein the catalyst is in form of block or powder.

8. The method as claimed in claim 1, wherein the catalyst is aluminum powder, and the purity of the aluminum powder is more than 99.9 %.

9. The method as claimed in claim 1, wherein the catalyst is treated by a diluted acid solution for a period of time before being placed into the reacting room.

10. The method as claimed in claim 1, wherein the growing substrate is placed above the catalyst.

11. The method as claimed in claim 1, wherein the reacting room comprises a gas inlet and a gas outlet, and the growing substrate is placed between the catalyst and the gas outlet.

12. The method as claimed in claim 1, further comprising of step (f) introducing a protective gas into the reacting room before step (c).

13. The method as claimed in claim 12, wherein there is a flow of protective gas, and the flow rate of the protective gas ranges from about 100 milliliter per minute to about 2000 milliliter per minute.

14. The method as claimed in claim 1, wherein in step (c) the air pressure in the reacting room ranges from about 1 torr to about 50 torrs.

15. The method as claimed in claim 1, wherein the ratio of silicon-containing gas and hydrogen gas ranges from about 10:1 to about 1:10.

16. The method as claimed in claim 1, wherein the silicon-containing gas is selected from a group comprising silicon halide, silane and a derivative thereof, halogenated silane, and combinations thereof.

17. The method as claimed in claim 16, wherein the silicon halide is silicon tetrachloride.

18. The method as claimed in claim 1, wherein there is a flow of the silicon-containing gas, and the flow rate of the silicon-containing gas ranges from about 10milliliters per minute to about 1000 milliliters per minute.

19. The method as claimed in claim 1, wherein the silicon-containing gas is introduced in a manner that the silicon-containing gas flows from the catalyst to the growing substrate.

20. A method for making silicon nano-structure, the method comprising the following steps of:
(a) providing a growing substrate and a growing device comprising a heating apparatus and a reacting room, wherein the growing substrate is a (100) silicon wafer having a (100) crystal plane;
(b) placing the growing substrate and a quantity of a catalyst into the reacting room, wherein the catalyst is pure aluminum;
(c) introducing a silicon-containing gas and a hydrogen gas into the reacting room;
(d) heating the reacting room to a temperature of about 660° C. to about 1100° C. to fabricate a first silicon nano-structure on the growing substrate, wherein the first silicon nano-structure comprises a plurality of first silicon nano pyramids formed on the (100) crystal plane, and the plurality of first silicon nano pyramids is a single crystalline and grows along a epitaxial <111>direction of the (100) crystal plane; and
(e) suspending the heating for a period of time to stop fabricating the first silicon nano-structure, keeping the growing substrate with the first silicon nano-structure thereon in the reacting room, and then restarting heating the reacting room to a temperature of about 660° C. to about 1100° C. to fabricate a second silicon nano-structure, wherein the second silicon nano-structure comprises a plurality of second silicon nano pyramids formed on the plurality of first silicon nano pyramids and substantially perpendicular to the (100) crystal plane.

\* \* \* \* \*